US010393958B2

(12) United States Patent
Boeuf et al.

(10) Patent No.: US 10,393,958 B2
(45) Date of Patent: Aug. 27, 2019

(54) ELECTRO-OPTIC DEVICE WITH MULTIPLE PHOTONIC LAYERS AND RELATED METHODS

(71) Applicant: STMicroelectronics (Crolles 2) SAS, Crolles (FR)

(72) Inventors: Frédéric Boeuf, Le Versoud (FR); Charles Baudot, Lumbin (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 16/029,365

(22) Filed: Jul. 6, 2018

(65) Prior Publication Data

US 2018/0329140 A1 Nov. 15, 2018

Related U.S. Application Data

(62) Division of application No. 15/132,408, filed on Apr. 19, 2016, now Pat. No. 10,042,115.

(51) Int. Cl.
| | |
|---|---|
| *G02B 6/12* | (2006.01) |
| *H01L 23/48* | (2006.01) |
| *H01L 23/00* | (2006.01) |
| *H01L 21/768* | (2006.01) |
| *H02S 40/44* | (2014.01) |
| *H01L 25/04* | (2014.01) |

(52) U.S. Cl.
CPC .... *G02B 6/12004* (2013.01); *H01L 21/76877* (2013.01); *H01L 21/76898* (2013.01); *H01L 23/481* (2013.01); *H01L 24/14* (2013.01); *H01L 25/043* (2013.01); *H02S 40/44* (2014.12); *H01L 24/13* (2013.01); *H01L 2924/00014* (2013.01); *H01L 2924/10252* (2013.01); *H01L 2924/10253* (2013.01); *H01L 2924/12042* (2013.01); *H01L 2924/14* (2013.01)

(58) Field of Classification Search
CPC .......... G02B 6/12004; H01L 21/76877; H01L 21/76898; H01L 23/481; H01L 24/14; H01L 2924/10252; H01L 2924/10253; H01L 2924/12042; H01L 2924/14
USPC .......................................................... 385/14
See application file for complete search history.

(56) References Cited

U.S. PATENT DOCUMENTS

| | | |
|---|---|---|
| 5,568,574 A | 10/1996 | Tanguay, Jr. et al. |
| 7,778,501 B2 * | 8/2010 | Beausoleil ............. B82Y 20/00 385/14 |
| 7,817,880 B1 | 10/2010 | Drost et al. |

(Continued)

*Primary Examiner* — Jerry M Blevins
(74) *Attorney, Agent, or Firm* — Slater Matsil, LLP

(57) ABSTRACT

A method for making an electro-optic device includes forming a first photonic device having a first material in a first photonic layer over a substrate layer. A second photonic layer with a second photonic device is formed over the first photonic layer and includes a second material different than the first material. A dielectric layer is formed over the second photonic layer. A first electrically conductive via extending through the dielectric layer and the second photonic layer is formed so as to couple to the first photonic device. A second electrically conductive via extending through the dielectric layer and coupling to the second photonic device is formed. A third electrically conductive via extending through the dielectric layer, the second photonic layer, and the first photonic layer is formed so as to couple to the substrate layer.

22 Claims, 9 Drawing Sheets

(56) References Cited

U.S. PATENT DOCUMENTS

| | | |
|---|---|---|
| 8,971,676 B1 | 3/2015 | Thacker et al. |
| 9,256,026 B2 | 2/2016 | Thacker et al. |
| 2012/0207426 A1 | 8/2012 | Doany et al. |
| 2013/0330033 A1* | 12/2013 | Yu ..................... H01S 5/02236 385/14 |
| 2014/0064659 A1 | 3/2014 | Doerr et al. |
| 2014/0270621 A1 | 9/2014 | Dutt et al. |
| 2016/0197111 A1* | 7/2016 | Coolbaugh ....... H01L 27/14625 257/432 |

* cited by examiner

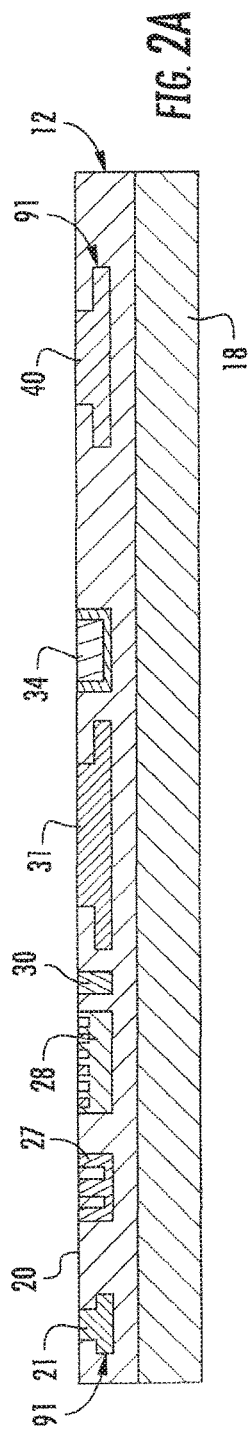
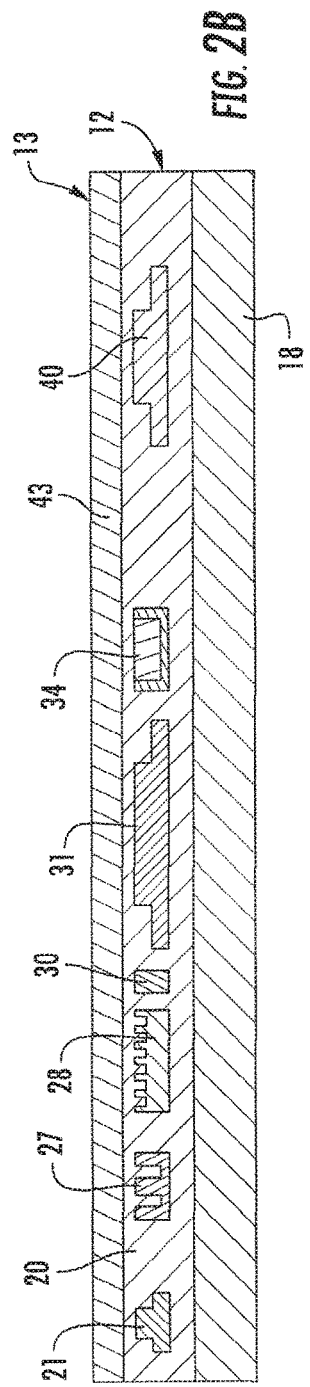
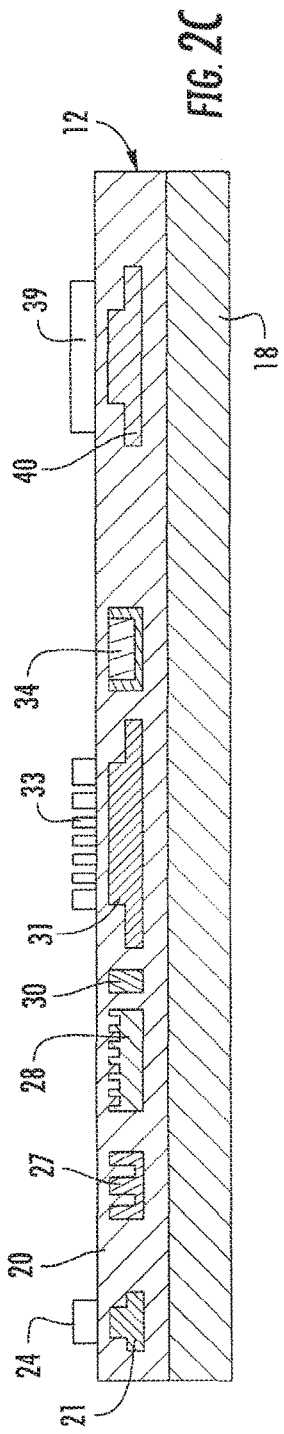

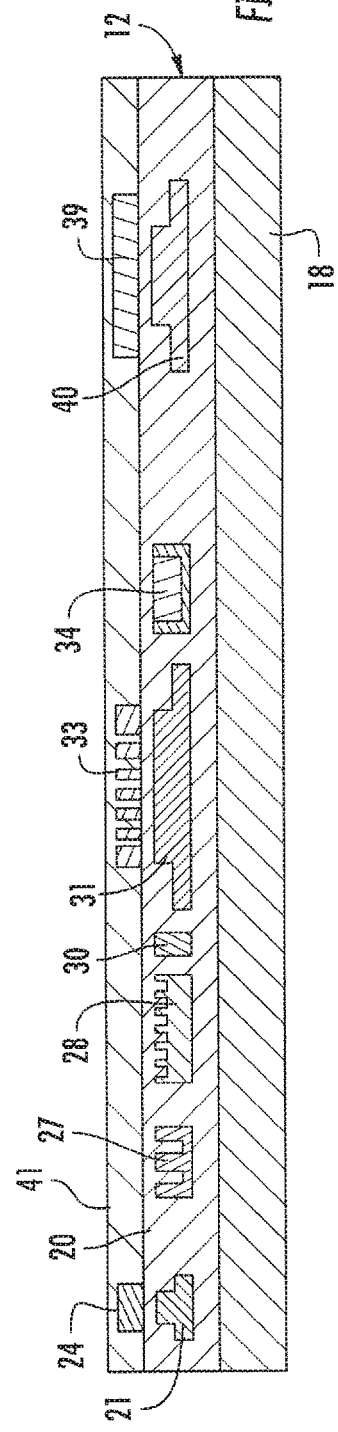

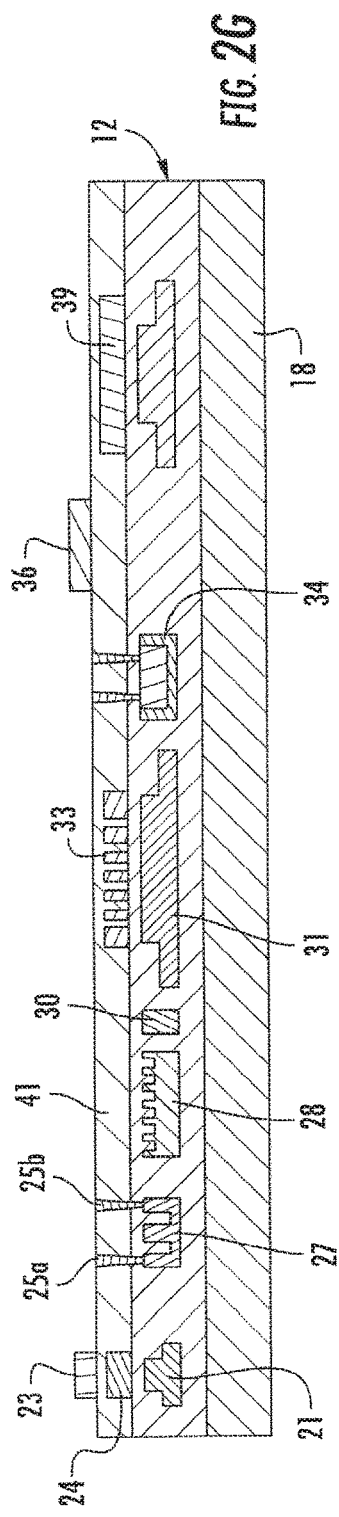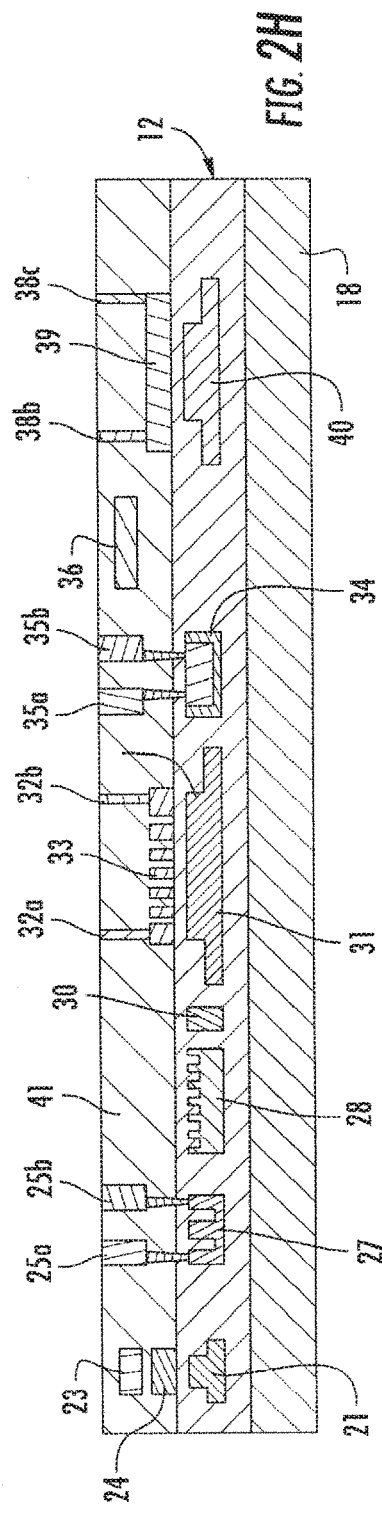

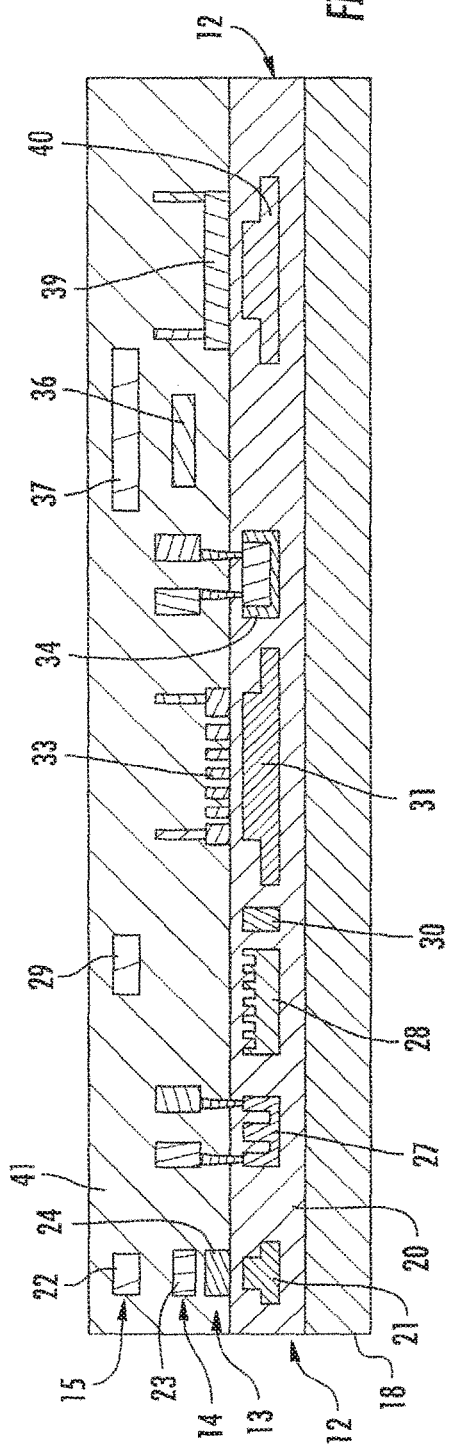
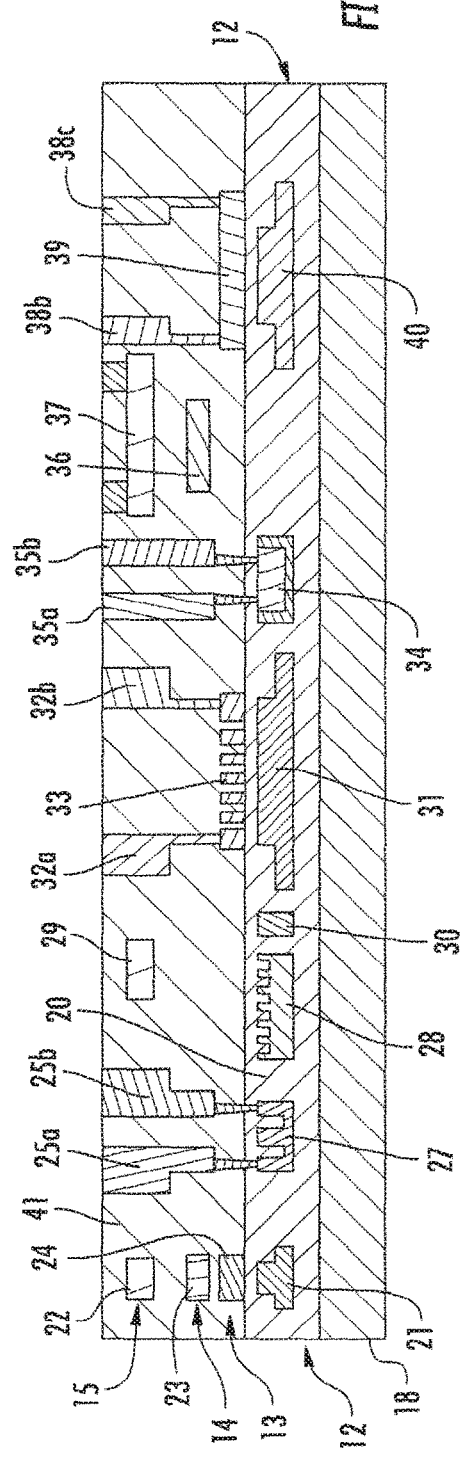

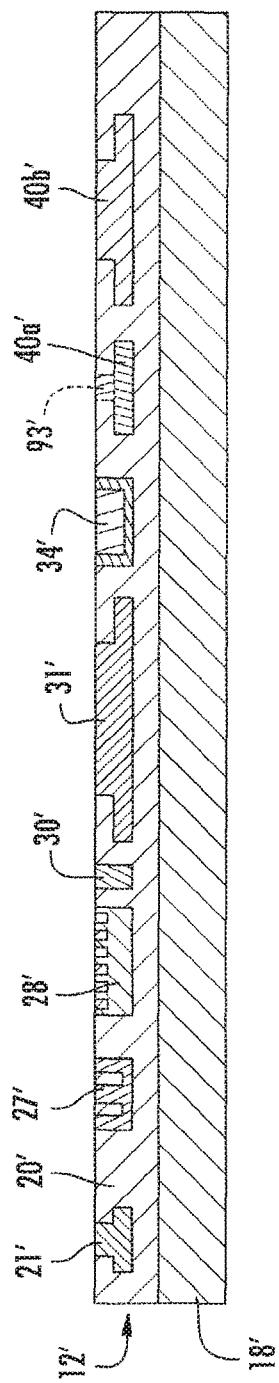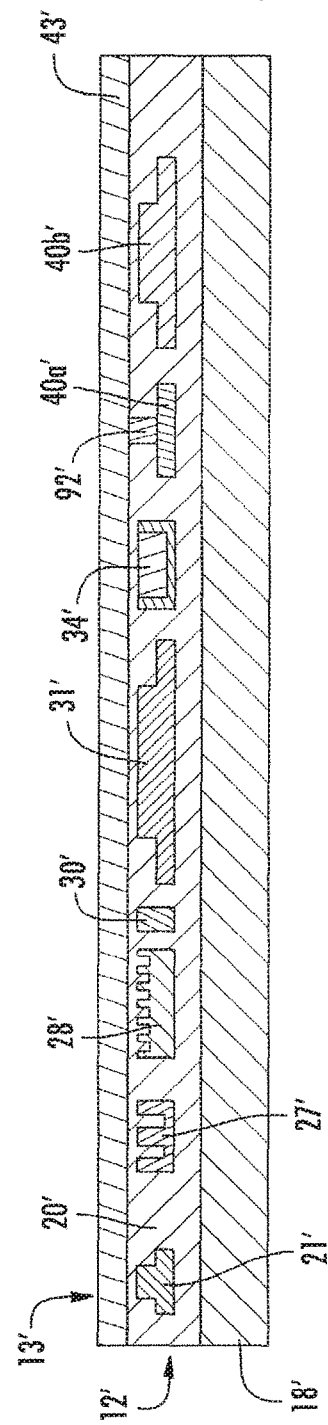

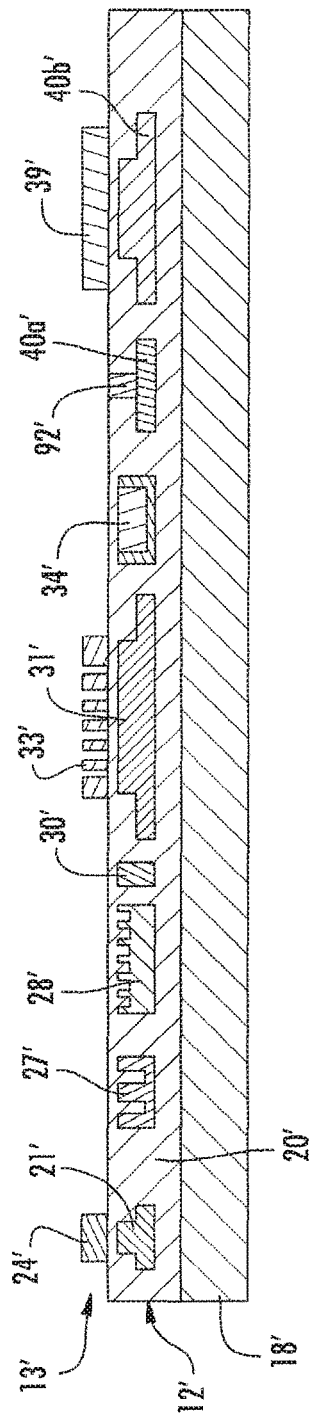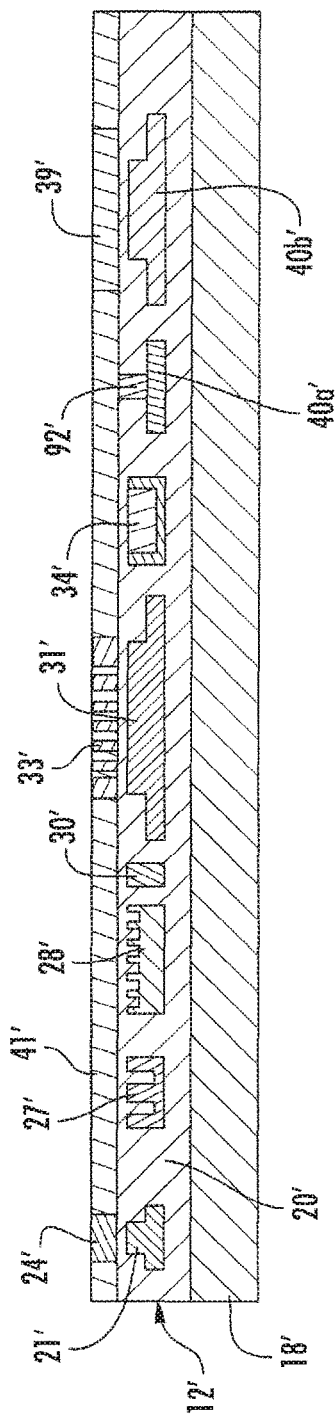

ELECTRO-OPTIC DEVICE WITH MULTIPLE PHOTONIC LAYERS AND RELATED METHODS

CROSS-REFERENCE TO RELATED APPLICATIONS

This application is a divisional application of U.S. application Ser. No. 15/132,408 filed on Apr. 19, 2016, which application is hereby incorporated herein by reference.

TECHNICAL FIELD

The present disclosure relates to the field of electro-optic devices, and, more particularly, to system-on-chip electro-optic devices and related methods.

BACKGROUND

Integrated optical devices for directly processing optical signals have become of greater importance as optical fiber communications increasingly replace metallic cable and microwave transmission links. Integrated optical devices can advantageously be implemented as silicon on insulator (SOI) optical circuits having compact dimensions at relatively low cost. SOI optical circuits employ integrated waveguide structures formed in the silicon layer of the SOI substrate.

In typical approaches, an electro-optic device comprises a silicon photonic chip with a photonic device (e.g. a laser) therein. The electro-optic device includes an integrated circuit (IC) carried by the photonic chip and for driving the photonic device. A potential drawback to this approach may comprise the limited flexibility of the type of photonic devices that can be supported by the silicon photonic chip.

SUMMARY

Generally speaking, an electro-optic device may include a substrate layer, and a first photonic layer over the substrate layer and comprising at least one first photonic device therein, the first photonic layer comprising a first material. The electro-optic device may include a second photonic layer over the first photonic layer and comprising at least one second photonic device therein, the second photonic layer comprising a second material different than the first material. The electro-optic device may comprise a dielectric layer over the second photonic layer, at least one first electrically conductive via extending through the dielectric layer and the second photonic layer to couple to the at least one first photonic device, and at least one second electrically conductive via extending through the dielectric layer and coupling to the at least one second photonic device. The electro-optic device may include at least one third electrically conductive via extending through the substrate layer, the second photonic layer, and the first photonic layer to couple to the substrate layer.

In some embodiments, the electro-optic device may include an IC over the dielectric layer and coupled to the at least one third electrically conductive via. The electro-optic device may also include a third photonic layer over the second photonic layer, the third photonic layer comprising a third material different than the first and second materials. The electro-optic device may comprise a fourth photonic layer over the third photonic layer, the fourth photonic layer comprising a fourth material. For example, the fourth material may comprise Germanium, and the first material may comprise silicon.

Additionally, the second material may comprise at least one of a group III semiconductor material, a group IV semiconductor material, and a group V semiconductor material, for example. In some embodiments, the electro-optic device may also comprise a plurality of ball contacts carried by the substrate layer. The at least one third electrically conductive via may comprise a through silicon via extending to a respective ball contact. The first photonic layer and the second photonic layer may each comprise aligned optical waveguides configured to transmit optical signals between the at least one first photonic device and the at least one second photonic device.

Another aspect is directed to a method for making an electro-optic device. The method may include forming at least one first photonic device in a first photonic layer over a substrate layer, the first photonic layer comprising a first material, and forming a second photonic layer over the first photonic layer and comprising at least one second photonic device therein, the second photonic layer comprising a second material different than the first material. The method may include forming a dielectric layer over the second photonic layer, forming at least one first electrically conductive via extending through the dielectric layer and the second photonic layer to couple to the at least one first photonic device, and forming at least one second electrically conductive via extending through the dielectric layer and coupling to the at least one second photonic device. The method may include forming at least one third electrically conductive via extending through the dielectric layer, the second photonic layer, and the first photonic layer to couple to the substrate layer.

BRIEF DESCRIPTION OF THE DRAWINGS

FIGS. 2A-2K are schematic cross-section views of stages in a method for making an electro-optic device, according to the present disclosure.

FIGS. 3A-3D are schematic cross-section views of stages in a method for making another embodiment of an electro-optic device, according to the present disclosure.

DETAILED DESCRIPTION OF ILLUSTRATIVE EMBODIMENTS

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime notation is used to indicate similar elements in alternative embodiments.

Figure 1:
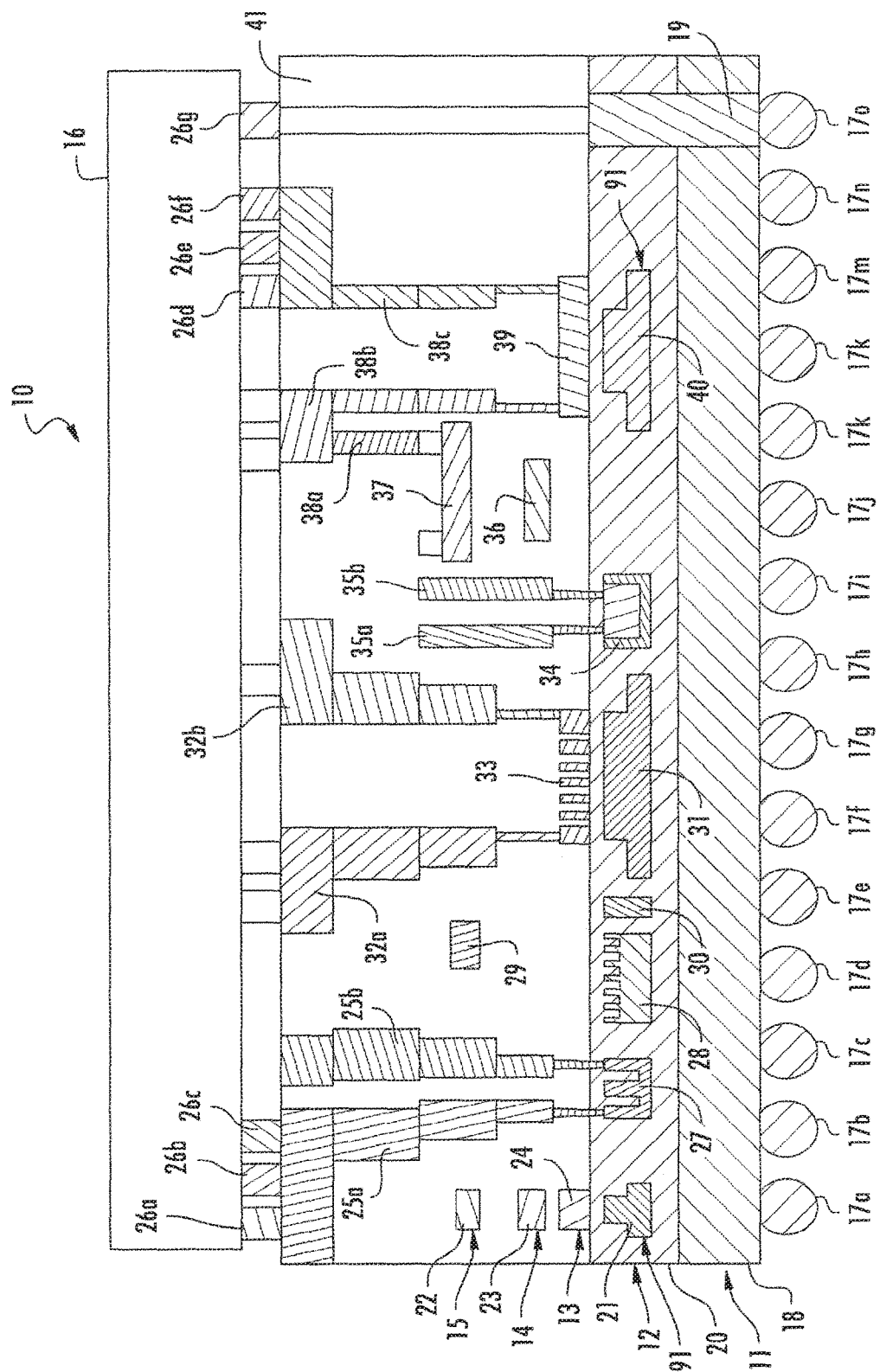
FIG. 1 is a schematic cross-section view of an electro-optic device, according to the present disclosure.

Referring initially to FIG. 1, an electro-optic device 10 according to the present disclosure is now described. The electro-optic device 10 illustratively includes a substrate layer ii, and a first photonic layer 12 over the substrate layer and comprising a plurality of first photonic devices 21, 27-28, 30-31, 34, 40 therein. The substrate layer 11 illustratively includes a semiconductor substrate 18 (e.g. a silicon substrate). The first photonic layer 12 has a first material 91 defining the plurality of first photonic devices 21, 27-28, 30-31, 34, 40, and a dielectric material (e.g. silicon dioxide) 20 surrounding the plurality of first photonic devices. In the illustrated embodiment, the plurality of first photonic devices comprises a light source 31, a modulator 27, an input grating coupler 28, a photodiode 34, and a set of optical waveguides 21, 30, 40.

The electro-optic device 10 illustratively includes a second photonic layer 13 over the first photonic layer 12 and comprising a plurality of second photonic devices 24, 33, 39 therein. The second photonic layer 13 has a second material 43 different than the first material 91. In this embodiment, the plurality of second photonic devices illustratively comprises an optical waveguide 24, a light source 33, and a modulator (e.g. electro-absorption or capacitive modulator) 39.

In the illustrated embodiment, the electro-optic device 10 illustratively includes a third photonic layer 14 over the second photonic layer 13. The third photonic layer 14 has a third material 44 different than the first material 91 and the second material 43. The third photonic layer 14 illustratively includes a plurality of third photonic devices 23, 36 therein. In this embodiment, the plurality of third photonic devices comprises a multiplexer and a demultiplexer 23, 36.

The electro-optic device 10 illustratively includes a fourth photonic layer 15 over the third photonic layer 14. The fourth photonic layer 15 has a fourth material 45. The fourth photonic layer 15 illustratively includes a plurality of fourth photonic devices 22, 29, 37 therein. In the depicted embodiment, the plurality of fourth photonic devices 22, 29, 37 includes optical waveguides 22, 29, and a laser light source/modulator 37. In some embodiments, the fourth material 45 is different from the first, second, and third materials 43, 44, but in other embodiments, the fourth material can comprise the second material or a combination thereof.

The electro-optic device 10 illustratively includes a dielectric layer 41 over the first photonic layer 12, the second photonic layer 13, the third photonic layer 14, and the fourth photonic layer 15. The dielectric layer 41 may comprise silicon dioxide, for example.

The electro-optic device 10 illustratively includes an IC 16 over the dielectric layer 41. The IC 16 may comprise at least one of a processor, a radio frequency (RF)/analog device configured to transmit/receive electrical signals to/from the active photonic devices, a memory, and a biometric device, for example. The first, second, third, and fourth photonic layers 12-15 each illustratively includes aligned optical waveguides 21-24 configured to transmit optical signals vertically (i.e. via adiabatic coupling) between the plurality of photonic layers. In each photonic layer 12-15, similar waveguides, not shown in FIG. 1, are configured to transmit optical signals horizontally between the plurality of first photonic devices 21, 27-28, 30-31, 34, 40, the plurality of second photonic devices 24, 33, 39, the plurality of third photonic devices 23, 36, and the plurality or fourth photonic devices 22, 29, 37. The aligned optical waveguides 21-24 utilize tapered shapes for allowing the optical signal to transit vertically between the various layers. In other embodiments, the optical waveguides 21-24 may be offset or only a subset of them may be aligned.

The electro-optic device 10 illustratively includes a plurality of first electrically conductive vias 25a-25b extending through the dielectric layer 41, the second, the third, and fourth photonic layers 13-15 to couple the IC 16 to some of the plurality of first photonic devices 21, 27-28, 30-31, 34, 40. The electro-optic device 10 illustratively includes a plurality of second electrically conductive vias 32a-32b, 38b-38c extending through the dielectric layer 41, the third, and fourth photonic layers 14-15 and coupling the IC 16 to the plurality of second photonic devices 24, 33, 39.

The electro-optic device 10 illustratively includes a third electrically conductive via 19 extending through the dielectric layer 41, the second, third, and fourth photonic layers 13-15 to couple the IC 16 to the substrate layer 11. Moreover, the electro-optic device 10 illustratively includes a plurality of ball contacts 17a-17o carried by the substrate layer 11. In other embodiments, the electro-optic device 10 may comprise a plurality of third electrically conductive vias. The third electrically conductive via 19 may at least partially comprise a through silicon via extending between the IC 16 and a respective ball contact 17o.

The electro-optic device 10 illustratively includes a plurality of fourth electrically conductive vias 35a-35b extending through the dielectric layer 41, the third, and fourth photonic layers 14-15 and coupling the plurality of fourth photonic devices 22, 29, 37 and the plurality of first photonic devices 21, 27-28, 30-31, 34, 40. The electro-optic device 10 illustratively includes a fifth electrically conductive via 38a extending through the dielectric layer 41 and coupling the IC 16 and the plurality of fourth photonic devices 22, 29, 37. In other embodiments, the electro-optic device 10 may comprise a plurality of fifth electrically conductive vias.

The electro-optic device 10 illustratively includes a plurality of electrically conductive pillars 26a-26g coupling the IC 16 and the first, second, third, fourth, and fifth pluralities of electrically conductive vias 25a-25b, 32a-32b, 38a-38c. Also, the first, second, third, fourth, and fifth pluralities of electrically conductive vias 25a-25b, 32a-32b, 35a-35b, 38a-38c, 19 may comprise one or more of copper and aluminum.

For example, the fourth material 45 may comprise germanium or silicon germanium, and the first material 91 may comprise silicon. The third material 44 may comprise silicon nitride, or aluminum nitride, for example (i.e. inactive material). The second material 43 may comprise at least one of a group III semiconductor material, a group IV semiconductor material (e.g. germanium), and a group V semiconductor material. In other embodiments, the second and fourth materials 43, 45 may alternatively comprise dielectric materials, and the third material 44 may comprise an active semiconductor material. Indeed, the illustrated ordering of the first, second, third, and fourth photonic layers 12-15 is exemplary, and could be reordered in other embodiments.

Another aspect is directed to a method for making an electro-optic device 10. The method may include forming at least one first photonic device 21, 27-28, 30-31, 34, 40 in a first photonic layer 12 over a substrate layer 11 (e.g. starting with a SOI wafer), the first photonic layer comprising a first material 91. The method may include forming a second photonic layer 13 over the first photonic layer 12 and comprising at least one second photonic device 24, 33, 39 therein, the second photonic layer comprising a second material 43 different than the first material 91. In some embodiments, the method may comprise forming a dielectric layer 41 over the second photonic layer 13, positioning an IC 16 over the dielectric layer, and forming at least one first electrically conductive via 25a-25b extending through the dielectric layer and the second photonic layer 13 to couple the IC to the at least one first photonic device 21, 27-28, 30-31, 34, 40. The method may include forming at least one second electrically conductive via 32a-32b, 38b-38c extending through the dielectric layer 41 and coupling the IC 16 to the at least one second photonic device 24, 33, 39, and forming at least one third electrically conductive via 19 extending through the dielectric layer, the second photonic layer 13, and the first photonic layer 12 to couple the IC to the substrate layer 11.

Advantageously, the electro-optic device 10 may use first, second, third, and fourth photonic layers 12-15 of different materials to realize several different functions, providing enhanced flexibility. In some embodiments, the electro-optic device 10 provides a system-on-chip (SoC) packaging approach. For example, the electro-optic device 10 may comprise a group III-V semiconductor laser (near infrared (IR) or mid IR), and modulator, a silicon transport near IR; mid-ex: multiplexer and a demultiplexer near IR, visible, germanium/silicon germanium: Mid/Far IR transport and modulation. Also, the disclosed method includes layer fabrication that can rely on wafer to wafer bonding, bonding of vignette or local epitaxial growth. Each of the first, second, third, and fourth photonic layers 12-15 is optically coupled to the others using the principle of tapers. Also, the electro-optic device 10 may include electrical connections are using through silicon vias or electrically conductive pillars.

Figure 2E:
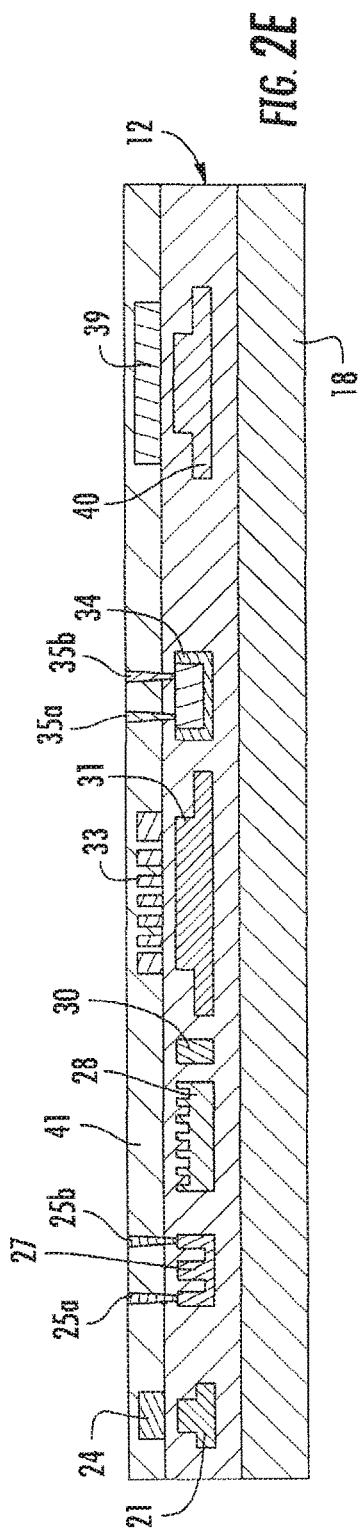
Figure 2F:
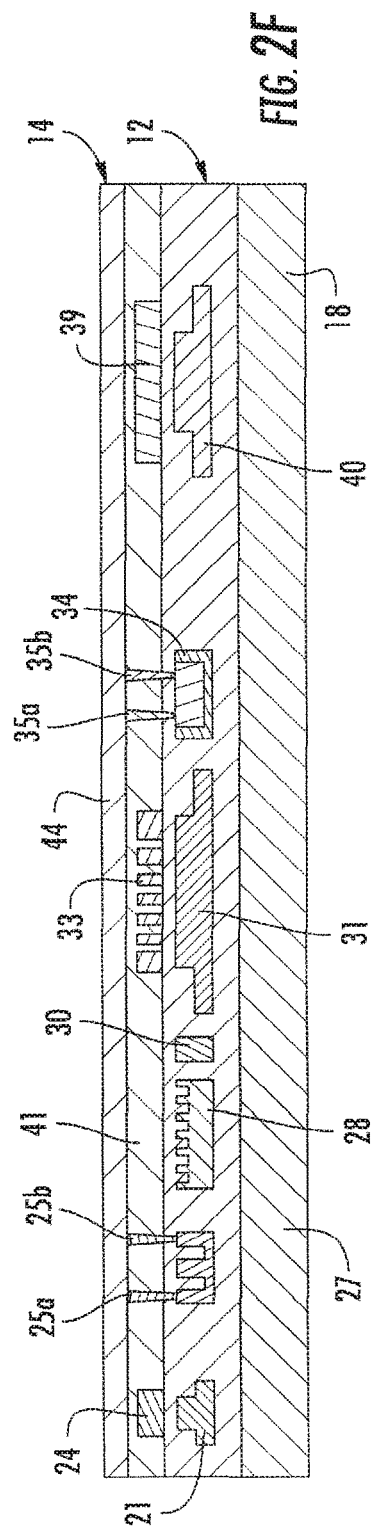

Referring now to FIGS. 2A-2K, an exemplary method for making the electro-optic device 10 is now described. In FIG. 2A, the semiconductor substrate 18 and the first photonic layer 12 are provided via a SOI wafer. In FIGS. 2B-2C, the second photonic layer 13 is formed (e.g. by Chemical Vapor Deposition (CVD) of a semiconductor material; or by direct bonding (i.e. molecular bonding) of a second wafer substrate comprising a semiconductor material, followed by a Smart-Cut process step to remove the second wafer substrate, leaving the semiconductor material; all these techniques are known to the skilled person) and then patterned (e.g. a photolithography step and etching step). In FIG. 2D, a lower portion of the dielectric layer 41 is formed, for example, a silicon oxide-based dielectric, deposited by CVD, and subsequently subjected to a Chemical Mechanical Polishing (CMP) process step. In FIG. 2E, the method includes the steps of depositing and patterning an electrically conductive material and to form portions of electrically conductive vias 25a-25b, 35a-35b. In FIGS. 2F-2G, the third photonic layer 14 is formed (e.g. by CVD of a dielectric material) and then patterned (e.g. a photolithography step and etching step). In FIG. 2H, an upper portion of the dielectric layer 41 is formed, and subsequently subjected to a CMP step. The dielectric material of photonic layer 14 may be selected so as to present a sufficient refractive index step with respect to the dielectric material selected for forming the dielectric layer 41, so that optical waveguides can be formed in photonic layer 14.

Figure 2I:
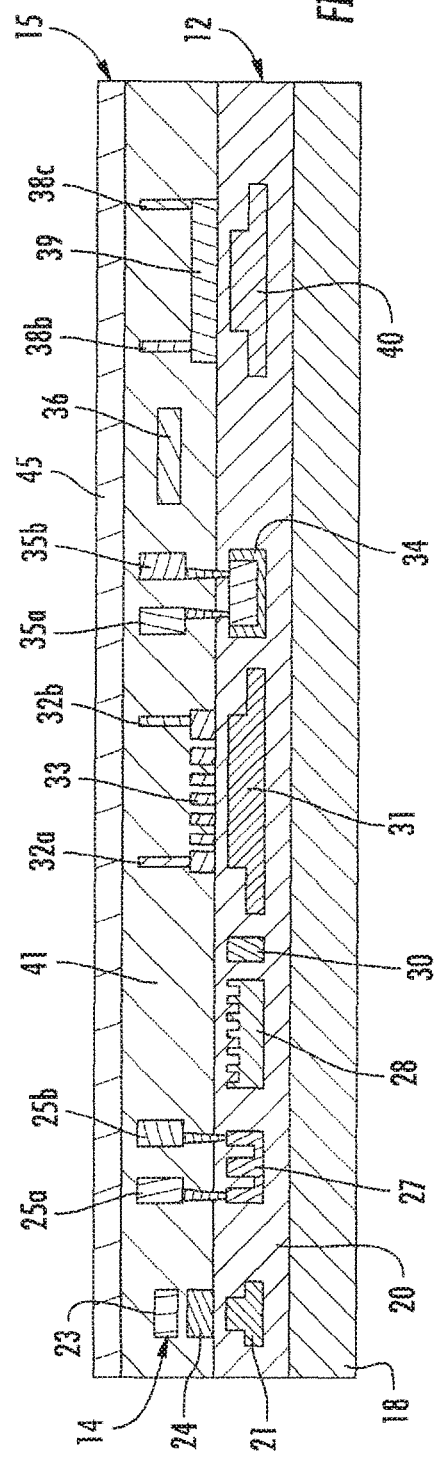

In FIGS. 2I-2J, the fourth photonic layer 15 is formed (e.g. similarly to the second photonic layer 13) and then patterned (e.g. a photolithography step and etching step). In FIG. 2K, the method includes the steps of depositing and patterning an electrically conductive material to form portions of electrically conductive vias 25a-25b, 32a-32b, 35a-35b, 38a-38c.

Referring now additionally to FIGS. 3A-3D, another embodiment of the method for making the electro-optic device 10' is now described. In this embodiment of the method for making the electro-optic device 10', those elements already discussed above with respect to FIGS. 2A-2K are given prime notation and most require no further discussion herein. This embodiment differs from the previous embodiment in that this method for making the electro-optic device 10' has the first photonic layer 12' further comprising additional first photonic devices 40a'-40b', and an optical waveguide 92' extending from a portion of the first photonic layer 12' to the second photonic layer 13'. The optical waveguide 92' comprises the second material 43'.

This embodiment also differs from the previous embodiment in that the formation of the second photonic layer 13' comprises a step of forming the second material 43' over the dielectric material 20' of the first photonic layer 12', by epitaxial growth from through an opening 93' formed in the dielectric material 20'. For purposes of simplification, only one such opening 93' is depicted on FIGS. 3A-3B. The person of ordinary skill in the art will appreciate the density of such openings to form a continuous layer of the second material over the entire surface of the dielectric material 20'. The second material is a semiconductor material and may, for example, comprise one of Germanium or Silicon Germanium alloy.

In FIG. 3C, the second material has been patterned to form the photonic devices, a waveguide 24', a light source 33' and passive device 39'. A portion 92' of the second photonic material of layer second photonic layer 13' remains in the opening 93' which has served for the epitaxial growth, this portion being unused. In FIG. 3D, the photonic devices are covered by a first layer of dielectric 41'.

Many modifications and other embodiments of the present disclosure will come to the mind of one skilled in the art having the benefit of the teachings presented in the foregoing descriptions and the associated drawings. It will be appreciated that the order in which the semiconductor/dielectric materials of second, third and fourth photonic layers could be changed. For example, second layer may comprise a dielectric material and third layer a semiconductor material. The number of photonic layers might be varied also. Therefore, it is understood that the present disclosure is not to be limited to the specific embodiments disclosed, and that modifications and embodiments are intended to be included within the scope of the appended claims.

What is claimed is:

1. A method for making an electro-optic device, the method comprising:
    forming a first photonic device in a first photonic layer over a substrate layer, the first photonic layer comprising a first material;
    forming a second photonic layer comprising a second photonic device, the second photonic layer being formed over the first photonic layer and comprising a second material different than the first material;
    forming a dielectric layer over the second photonic layer;
    forming a first electrically conductive via extending through the dielectric layer and the second photonic layer to couple to the first photonic device;
    forming a second electrically conductive via extending through the dielectric layer and coupling to the second photonic device;
    forming a third electrically conductive via extending through the dielectric layer, the second photonic layer, and the first photonic layer to couple to the substrate layer; and
    forming a third photonic layer over the second photonic layer, the third photonic layer comprising a third material different than the first and second materials, wherein the first and the second materials are different type of semiconductor materials and the third material is a dielectric material.

2. The method of claim 1, further comprising positioning an integrated circuit (IC) over the dielectric layer.

3. The method of claim 1, further comprising forming a fourth photonic layer over the third photonic layer, the fourth photonic layer comprising a fourth material.

4. The method of claim 3, wherein the fourth material comprises germanium, and wherein the first material comprises silicon.

5. The method of claim 1, wherein the second material comprises at least one of a group III semiconductor material, a group IV semiconductor material, and a group V semiconductor material.

6. The method of claim 1, further comprising forming a plurality of ball contacts carried by the substrate layer.

7. The method of claim 6, wherein the third electrically conductive via comprises a through silicon via extending to a respective ball contact.

8. The method of claim 1, wherein the first photonic layer and the second photonic layer each comprises aligned optical waveguides configured to transmit optical signals between the first photonic device and the second photonic device.

9. A method for making an electro-optic device, the method comprising:
forming a transport layer comprising a first semiconductor material disposed over a semiconductor substrate, the transport layer comprising a first photonic device;
forming a compound semiconductor layer disposed over the semiconductor substrate, the compound semiconductor layer comprising a second semiconductor material different from the first semiconductor material, the compound semiconductor layer comprising a second photonic device comprising a light source; and
forming a nitride layer disposed over the semiconductor substrate, the nitride layer comprising a dielectric material, wherein the nitride layer comprises a third photonic device comprising a multiplexer or a demultiplexer, wherein the transport, compound semiconductor, and nitride layers are optically coupled with each other.

10. The method of claim 9, wherein forming the compound semiconductor layer comprises:
bonding a second wafer substrate comprising a layer of a compound semiconductor to the transport layer;
removing the second wafer substrate to leave the layer of the compound semiconductor;
patterning the layer of the compound semiconductor;
depositing a dielectric material around the patterned layer of the compound semiconductor; and
planarizing the dielectric material.

11. The method of claim 9, wherein forming the compound semiconductor layer comprises:
depositing a layer of a compound semiconductor over the transport layer;
patterning the layer of the compound semiconductor;
depositing a dielectric material around the patterned layer of the compound semiconductor; and
planarizing the dielectric material.

12. The method of claim 9, wherein forming the compound semiconductor layer comprises:
forming an opening in the transport layer to the first photonic device; and
using a local epitaxy process, growing a layer of a compound semiconductor over the transport layer;
patterning the layer of the compound semiconductor;
depositing a dielectric material around the patterned layer of the compound semiconductor; and
planarizing the dielectric material.

13. The method of claim 9, further comprising forming a plurality of vias coupling the transport, compound semiconductor, and nitride layers with each other.

14. The method of claim 9, further comprising forming a transport and modulation layer disposed over the nitride layer, the transport and modulation layer comprising a third semiconductor material different from the first and second semiconductor materials, wherein the transport and modulation layer comprises a fourth photonic device.

15. The method of claim 14, wherein forming the transport and modulation layer comprises:
depositing a layer of the third semiconductor material over the nitride layer; and
patterning the layer of the third semiconductor material to form the fourth photonic device.

16. The method of claim 14, wherein the third semiconductor material comprises germanium.

17. The method of claim 14, further comprising forming a plurality of vias coupling the transport, compound semiconductor, and nitride layers and the transport and modulation layer with each other.

18. A method for making an electro-optic device, the method comprising:
forming a silicon based photonic device over a semiconductor substrate in a first dielectric layer;
forming a compound semiconductor material based photonic device over the silicon based photonic device in a second dielectric layer;
forming a nitride dielectric material based photonic device over the compound semiconductor material based photonic device in a third dielectric layer; and
forming a germanium based photonic device over the nitride dielectric material based photonic device in a fourth dielectric layer, wherein the silicon based photonic device, the compound semiconductor material based photonic device, the nitride dielectric material based photonic device, and the germanium based photonic device are optically coupled with each other; and
forming a plurality of vias in the first, second, third, fourth dielectric layers, wherein the silicon based photonic device, the compound semiconductor material based photonic device, the nitride dielectric material based photonic device, and the germanium based photonic device form a system on chip (SOC) device.

19. The method of claim 18, wherein forming the compound semiconductor material based photonic device comprises:
bonding a second wafer substrate comprising a layer of a compound semiconductor to the first dielectric layer;
removing the second wafer substrate to leave the layer of the compound semiconductor;
patterning the layer of the compound semiconductor;
depositing a second dielectric material around the patterned layer of the compound semiconductor; and
planarizing the second dielectric material.

20. The method of claim 18, wherein forming the compound semiconductor material based photonic device comprises:
depositing a layer of a compound semiconductor over the first dielectric layer;
patterning the layer of the compound semiconductor;
depositing a second dielectric material around the patterned layer of the compound semiconductor; and
planarizing the second dielectric material.

21. The method of claim 18, wherein forming the compound semiconductor material based photonic device comprises:
forming an opening in the first dielectric layer to the silicon based photonic device; and using a local epitaxy process, growing a layer of a compound semiconductor over the first dielectric layer;
patterning the layer of the compound semiconductor;
depositing a second dielectric material around the patterned layer of the compound semiconductor; and
planarizing the second dielectric material.

22. The method of claim 18, wherein the silicon based photonic device, the compound semiconductor material based photonic device, the nitride dielectric material based photonic device, and the germanium based photonic device are formed to be aligned with each other and include a tapered shape.

* * * * *